United States Patent
Hosono et al.

(10) Patent No.: US 11,871,590 B2
(45) Date of Patent: Jan. 9, 2024

(54) THIN FILM OF METAL OXIDE, ORGANIC ELECTROLUMINESCENT DEVICE INCLUDING THIN FILM, PHOTOVOLTAIC CELL INCLUDING THIN FILM, AND MANUFACTURING METHOD OF THIN FILM

(71) Applicant: JAPAN SCIENCE AND TECHNOLOGY AGENCY, Kawaguchi (JP)

(72) Inventors: Hideo Hosono, Meguro-ku (JP); Yoshitake Toda, Meguro-ku (JP); Satoru Watanabe, Chiyoda-ku (JP); Toshinari Watanabe, Chiyoda-ku (JP); Kazuhiro Ito, Chiyoda-ku (JP); Naomichi Miyakawa, Chiyoda-ku (JP); Nobuhiro Nakamura, Chiyoda-ku (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 432 days.

(21) Appl. No.: 17/152,142

(22) Filed: Jan. 19, 2021

(65) Prior Publication Data
US 2021/0343961 A1    Nov. 4, 2021

Related U.S. Application Data

(60) Division of application No. 16/169,078, filed on Oct. 24, 2018, now abandoned, which is a division of
(Continued)

(30) Foreign Application Priority Data

Sep. 18, 2014 (JP) ................................ 2014-190364

(51) Int. Cl.
*H10K 30/15* (2023.01)
*C23C 14/08* (2006.01)
(Continued)

(52) U.S. Cl.
CPC ........... *H10K 30/152* (2023.02); *C23C 14/08* (2013.01); *C23C 14/086* (2013.01);
(Continued)

(58) Field of Classification Search
CPC .. H10K 50/16; H10K 50/171; H10K 2102/00; H10K 30/50; H10K 30/353;
(Continued)

(56) References Cited

U.S. PATENT DOCUMENTS

2012/0261712 A1    10/2012    Diekmann et al.
2013/0113587 A1    5/2013    Inque et al.
(Continued)

FOREIGN PATENT DOCUMENTS

CN    103038888    4/2013
CN    103346221    10/2013
(Continued)

OTHER PUBLICATIONS

Office Action dated Sep. 3, 2021 in corresponding Korean Patent Application No. 10-2017-7007147, 5 pages
(Continued)

*Primary Examiner* — Alia Sabur
(74) *Attorney, Agent, or Firm* — Oblon, McClelland, Maier & Neustadt, L.L.P.

(57) ABSTRACT

A thin film of metal oxide includes zinc (Zn); tin (Sn); silicon (Si); and oxygen (O). In terms of oxide, based on 100 mol % of total of oxides of the thin film, $SnO_2$ is greater than 15 mol % but less than or equal to 95 mol %.

11 Claims, 6 Drawing Sheets

Related U.S. Application Data application No. 15/460,455, filed on Mar. 16, 2017, now abandoned, which is a continuation of application No. PCT/JP2015/076346, filed on Sep. 16, 2015.

(51) Int. Cl.

| | | |
|---|---|---|
| C23C 14/34 | (2006.01) | |
| C23C 14/35 | (2006.01) | |
| H01L 21/02 | (2006.01) | |
| H01J 37/34 | (2006.01) | |
| H01L 31/032 | (2006.01) | |
| H10K 50/16 | (2023.01) | |
| H10K 50/18 | (2023.01) | |
| H10K 50/17 | (2023.01) | |
| H10K 102/00 | (2023.01) | |
| H10K 102/10 | (2023.01) | |
| H01L 31/0256 | (2006.01) | |

(52) U.S. Cl.
CPC ...... *C23C 14/3407* (2013.01); *C23C 14/3414* (2013.01); *C23C 14/352* (2013.01); *H01J 37/3429* (2013.01); *H01L 21/02565* (2013.01); *H01L 21/02631* (2013.01); *H01L 31/0324* (2013.01); *H01L 2031/0344* (2013.01); *H10K 50/16* (2023.02); *H10K 50/171* (2023.02); *H10K 50/18* (2023.02); *H10K 2102/00* (2023.02); *H10K 2102/102* (2023.02); *Y02E 10/549* (2013.01); *Y02P 70/50* (2015.11)

(58) Field of Classification Search
CPC ........... H01L 21/02631; H01L 29/7869; C23C 14/086; H01G 9/204; H01G 9/2036
See application file for complete search history.

(56) References Cited

U.S. PATENT DOCUMENTS

| | | | | |
|---|---|---|---|---|
| 2013/0119324 A1* | 5/2013 | Morita | ............... | H01L 29/24 252/519.1 |
| 2014/0174528 A1 | 6/2014 | Higashi et al. | | |
| 2014/0175440 A1 | 6/2014 | Mohammed et al. | | |
| 2015/0028305 A1* | 1/2015 | Niu | ............... | C09K 11/565 257/40 |
| 2015/0137103 A1 | 5/2015 | Hosono et al. | | |
| 2016/0285027 A1 | 9/2016 | Hosono et al. | | |
| 2017/0005282 A1* | 1/2017 | Maehara | ............. | H10K 30/353 |

FOREIGN PATENT DOCUMENTS

| | | | |
|---|---|---|---|
| JP | 2001-176667 | | 6/2001 |
| JP | 2007314364 A | * | 12/2007 |
| JP | 2012-049487 | | 3/2012 |
| JP | 2012-49489 | | 3/2012 |
| JP | 2014-55324 A | | 3/2014 |
| JP | 2014055324 A | * | 3/2014 |
| TW | 201220498 A1 | | 5/2012 |
| TW | 201407849 A | | 2/2014 |
| TW | 201531594 | | 8/2015 |
| WO | WO 2013/031217 A1 | | 3/2013 |
| WO | WO 2013/191212 A1 | | 12/2013 |

OTHER PUBLICATIONS

International Search Report dated Dec. 8, 2015 in PCT/JP2015/076346, filed on Sep. 16, 2015 (with English Translation).
Written Opinion dated Dec. 8, 2015 in PCT/JP2015/076346, filed on Sep. 16, 2015.
Nikolic et al. ("Far infrated properties of bulk sintered and thin film Zn2SnO4"), Materials Science and Engineering B 138 (2007) 7-11.
Chong et al. ("First-principle study of amorphous SiZnSnO thin-film transistor with excellent stability"), Thin Solid Films 534 (2013) 609-613.
Li et al. ("Effect of Zn/Sn ratio on structure and properties of ZnO-SnO2 nanocomposite films"); Journal of Alloys and Compounds 611 (2014) 219-224.
Taiwanese Office Action dated May 15, 2020 in corresponding Taiwan R.O.C. patent Application No. 104131030.
Liu Bo-zhi, et al., "QD-LED devices using ZnSnO as an electron-transporting layer", Acta Physica Sinica, Aug. 5, 2013, vol. 62, issue 15, Article No. 158504, with English Abstract.
Jiwan Kim et al., "Effects of oxide electron transport layer on quantum dots light emitting diode with an organic/inorganic hybrid structure", Electronic Materials Letters, 2013, vol. 9, pp. 779-792.
Japanese Office Action dated Jun. 16, 2020, in corresponding Japanese Patent Application No. 2019-156940.

\* cited by examiner

THIN FILM OF METAL OXIDE, ORGANIC ELECTROLUMINESCENT DEVICE INCLUDING THIN FILM, PHOTOVOLTAIC CELL INCLUDING THIN FILM, AND MANUFACTURING METHOD OF THIN FILM

CROSS-REFERENCE TO RELATED APPLICATION

The present application is a divisional of U.S. patent application Ser. No. 16/169,078, filed on Oct. 24, 2018, which is a divisional of U.S. patent application Ser. No. 15/460,455, filed on Mar. 16, 2017, which is a continuation of International Application No. PCT/JP2015/076346, filed on Sep. 16, 2015. This application claims priority to Japanese Patent Application No. 2014-190364, filed on Sep. 18, 2014. The entire contents of the foregoing applications are incorporated herein by reference.

BACKGROUND OF THE INVENTION

1. Field of the Invention

The present invention relates to a thin film of metal oxide, an organic electroluminescent device including the thin film, a photovoltaic cell including the thin film, a photovoltaic cell including the thin film, and a manufacturing method of the thin film.

2. Description of the Related Art

Photoelectric conversion devices such as organic electroluminescent devices, photovoltaic cells or the like are widely developed. For example, organic electroluminescent devices are widely used for displays, backlights, illuminations and the like.

Generally, an organic electroluminescent device includes two electrodes (an anode and a cathode) and an organic light emitting layer provided between these electrodes. When applying a voltage between the electrodes, holes and electrons are injected into the organic light emitting layer from the respective electrodes. When the holes and the electrons are recombined in the organic light emitting layer, binding energy is generated to excite organic luminescent materials in the organic light emitting layer. As light emissions occur when the excited luminescent materials return to the ground state, a luminescent device is obtained by using this phenomenon.

Here, generally, the organic electroluminescent device further includes a hole injection layer and/or a hole transport layer, and an electron injection layer and/or an electron transport layer. The hole injection layer and the hole transport layer are provided between the anode and the organic light emitting layer, and have a function to selectively inject holes into the organic light emitting layer. Further, the electron injection layer and the electron transport layer are provided between the cathode and the organic light emitting layer, and have a function to selectively inject electrons into the organic light emitting layer (See Japanese Unexamined Patent Application Publication No. 2001-176667). It is known that luminous efficiency of the organic electroluminescent device is increased by providing such layers.

Further, a general photovoltaic cell includes a pair of electrodes and a photoelectric conversion layer provided between the electrodes. In accordance with the injection of light, holes and electrons are generated in the photoelectric conversion layer. When these holes and electrons are, respectively, extracted from an electrode for extracting the holes and from an electrode for extracting the electrons electric power is generated. Further, when the photovoltaic cell functions as a photodetector, light is converted to an electric signal at the photoelectric conversion layer and the light is detected.

It is preferable for the photovoltaic cell as well that an n-type semiconductor layer, referred to as a buffer layer, is provided between the electrode on the side where electrons are extracted and the photoelectric conversion layer. By providing this layer conversion efficiency of the photovoltaic cell can be increased.

SUMMARY OF THE INVENTION

It is a general object of at least one embodiment of the present invention to provide a thin film of metal oxide, an organic electroluminescent device including thin film, a photovoltaic cell including thin film, and a manufacturing method of thin film that substantially obviate one or more problems caused by the limitations and disadvantages of the related art.

The present invention provides a thin film of metal oxide including zinc (Zn); tin (Sn); silicon (Si); and oxygen (O), $SnO_2$ being greater than 15 mol % but less than or equal to 95 mol % in terms of oxide based on 100 mol % of total of oxides of the thin film.

Here, in the thin film of metal oxide, $SiO_2$ may be greater than or equal to 7 mol % but less than or equal to 30 mol % based on 100 mol % of total of the oxides of the thin film in terms of oxide.

Moreover, the present invention provides an organic electroluminescent device including a thin film, the thin film being a thin film of metal oxide including zinc (Zn), tin (Sn), and oxygen (O), and $SnO_2$ being greater than 15 mol % but less than or equal to 95 mol % in terms of oxide based on 100 mol % of total of oxides of the thin film.

Furthermore, the present invention provides a photovoltaic cell including a thin film, the thin film being a thin film of metal oxide including zinc (Zn), tin (Sn), and oxygen (O), and $SnO_2$ being greater than 15 mol % but less than or equal to 95 mol % in terms of oxide based on 100 mol % of total of oxides of the thin film.

Furthermore, the present invention provides a manufacturing method of the above-described thin film including the following: before forming the thin film in a chamber by a sputtering method, reducing a pressure in the chamber to $8.0 \times 10^{-4}$ Pa or less; introducing a sputtering gas into the chamber; and setting the pressure in the chamber to 0.1 Pa or more but 5.0 Pa or less, to perform deposition for the thin film.

BRIEF DESCRIPTION OF THE DRAWINGS

Other objects and further features of embodiments will become apparent from the following detailed description when read in conjunction with the accompanying drawings, in which.

DESCRIPTION OF THE PREFERRED EMBODIMENTS

Figure 1:
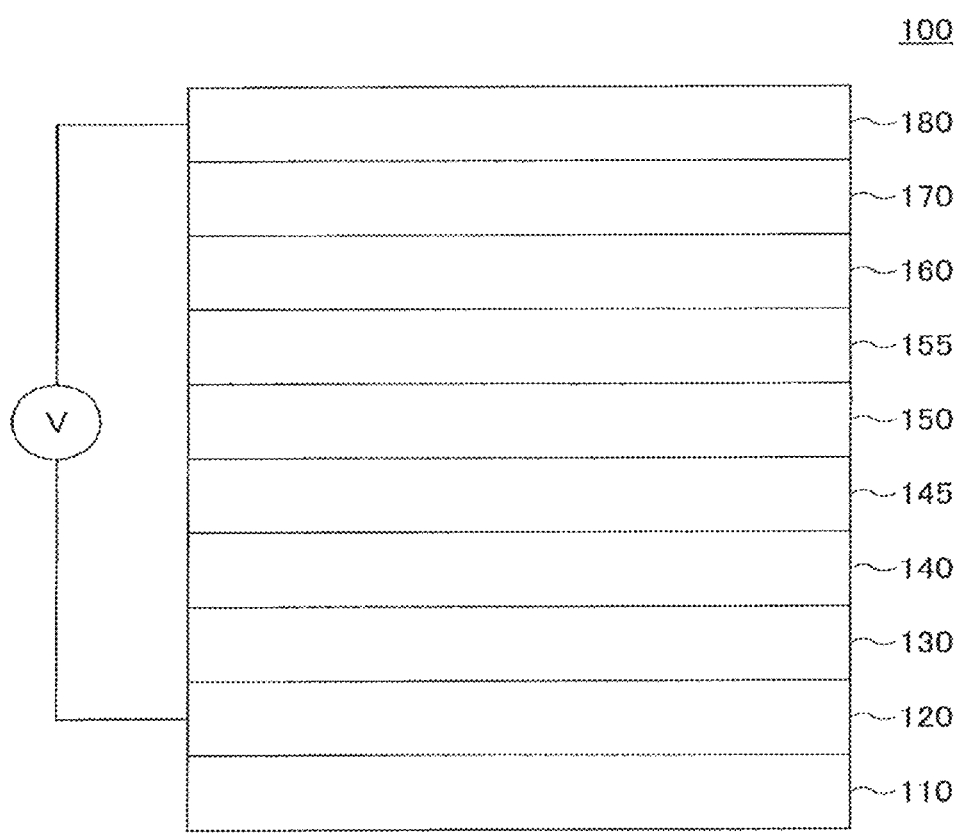
FIG. 1 is a cross-sectional view schematically illustrating a structure of an organic electroluminescent device of an example of the present invention.

In the present invention, "a metal oxide including zinc (Zn), tin (Sn), and oxygen (O); in terms of oxide, based on 100 mol % of total of the metal oxides, $SnO_2$ being greater than 15 mol % but less than or equal to 95 mol %; and not including silicon (Si)" also will be referred to specifically as "ZTO".

Moreover, in the present invention, "a metal oxide including zinc (Zn), tin (Sn), silicon (Si), and oxygen (O); and in terms of oxide, based on 100 mol % of total of the metal oxides, $SnO_2$ being greater than 15 mol % but less than or equal to 95 mol %" also will be referred to specifically as "ZTSO".

Furthermore, "ZTO" and "ZTSO" are also referred to simply as "metal oxide". These thin films will also be referred to collectively as "thin films of metal oxides". Therefore, in the present application, the "thin films of metal oxides" include a thin film of ZTO and a thin film of ZTSO.

Furthermore, in the present application, thin films of ZTO and ZTSO may be amorphous materials, microcrystal, or a mixed material of the amorphous material and the microcrystal.

(Thin Film of Metal Oxide)

According to an embodiment of the present invention, there is provision for thin films of metal oxides (ZTO and ZTSO) including zinc (Zn), tin (Sn), and oxygen (O); and in terms of oxide, based on 100 mol % of total of oxides of the thin films, $SnO_2$ being greater than 15 mol % but less than or equal to 95 mol %. Among the thin films of the metal oxides, a thin film including silicon (Si) is a thin film of ZTSO, a thin film that does not substantially include silicon (Si) is a thin film of ZTO.

(Thin Film of ZTSO)

According to the embodiment of the present invention, there is provision for a thin film of a metal oxide (ZTSO) including zinc (Zn), tin (Sn), silicon (Si), and oxygen (O); and in terms of oxide, based on 100 mol % of total of the thin film, $SnO_2$ being greater than 15 mol % but less than or equal to 95 mol %. When in terms of oxide based on 100 mol % of total of the metal oxides, $SnO_2$ is less than or equal to 15 mol %, crystallization temperature is low and crystallization has a tendency to occur in a heat treatment step performed in various processes; and, for a thin film, an amorphous state, a microcrystal state, or a mixed amorphous and microcrystal state cannot be maintained. When in terms of oxide based on 100 mol % of total of the metal oxides, $SnO_2$ is greater than 95 mol %, sintering is difficult, and a good oxide target cannot be obtained; in such a case, forming a thin film is difficult.

In ZTSO, in terms of oxide based on 100 mol % of total of the metal oxide, $SnO_2$ is, for example, greater than or equal to 30 mol % but less than or equal to 70 mol %. In terms of oxide based on 100 mol % of total of the metal oxide, $SnO_2$ also may be, for example, greater than or equal to 35 mol % but less than or equal to 60 mol %, and is preferably greater than or equal to 40 mol % but less than or equal to 50 mol %.

Moreover, in ZTSO, in terms of oxide based on 100 mol % of total of the metal oxide, $SiO_2$ is, for example, greater than or equal to 7 mol % but less than or equal to 30 mol %. When in terms of oxide based on 100 mol % of total of the metal oxide, $SiO_2$ is greater than or equal to 7 mol % but less than or equal to 30 mol %, electron affinity is not too great, and volume resistivity is not too high. In terms of oxide based on 100 mol % of total of the metal oxide, $SiO_2$ may be, for example, greater than or equal to 8 mol % but less than or equal to 28 mol %, and is preferably greater than or equal to 10 mol % but less than or equal to 25 mol %.

The thin film of ZTSO can be formed by performing a film deposition on a substrate by the vapor deposition method using a target including zinc (Zn), tin (Sn) and silicon (Si).

In the present application, the "vapor deposition method" is referred to as a generic term of the film deposition methods in which a raw material of the target is evaporated and deposited on the substrate, including a physical vapor deposition (PVD) method, a PLD method, a sputtering method, and a vacuum deposition method.

The sputtering method includes a DC (direct current) sputtering method, a high frequency sputtering method, a helicon wave sputtering method, an ion beam sputtering method, a magnetron sputtering method, and the like. With the sputtering method, a thin film can be formed relatively uniformly, in a large area region.

A target including Zn, Sn, and Si may be used. Zn, Sn, and Si may be included in a single target, or may be included separately in a plurality of targets. In the target, each of Zn, Sn and Si may exist as a metal or a metal oxide, or may exist as an alloy or a composite metal oxide. The metal oxide or the composite metal oxide may be a crystal, or may be an amorphous material.

The target may include one or more other metal components selected from a group including Ti, In, Ga, Nb, and Al, in addition to Zn, Sn and Si. Zn, Sn, Si and the other metal components may be included in a single target, or may be included separately in a plurality of targets. In the target, Zn, Sn, Si and the other metal components may exist as metals or metal oxides, respectively, or may exist as an alloy of two or more kinds of metals or as a composite metal oxide. The metal oxide or the composite metal oxide may be a crystal, or may be an amorphous material.

A relative density of the target is preferably 90% or more.

When a single target is used, a fraction by numbers of atoms for Si/(Zn+Sn+Si) in the target may be from 0.01 to 0.70, or may be from 0.05 to 0.30, or may be from 0.07 to 0.25, or may be from 0.10 to 0.20. When the numbers of atoms are within the above-described range, a bulk oxide body can be easily obtained by sintering. Moreover, when the numbers of atoms are within the above-described range, by the cold isostatic pressing (CIP) method, a bulk metal body can be easily obtained.

A composition analysis for the target can be performed by the XRF (X-ray fluorescence) method or the like. The composition of the formed thin film of ZTSO may be different from the composition ratio of the used target.

When a plurality of targets are used, for example, by simultaneously sputtering a target of metal Sn, a target of Zn, and a target of Si, the thin film of ZTSO according to the embodiment of the present invention can be obtained. Other combinations of the plurality of targets include, a combination of a target of ZnO, a target of $SnO_2$ and a target of $SiO_2$; a combination of a plurality of targets including ZnO, $SnO_2$ and $SiO_2$ but with a differing ratio of ZnO; a combination of an alloy target of metal ZnSn and a target of metal Si; a combination of a target of the alloy target of metal ZnSn and a target of $SiO_2$; a combination of a target including metal Zn or metal Sn and a target including ZnO and $SiO_2$, and the like.

When the plurality of targets are used simultaneously, by controlling an electric power applied to each of the targets, a thin film of ZTSO having a desired composition can be obtained.

The pressure of the sputtering gas (pressure inside a chamber of the sputtering apparatus) is preferably from 0.1 Pa to 5.0 Pa, more preferably from 0.3 Pa to 4.0 Pa, and further preferably from 0.5 Pa to 3.0 Pa. When the pressure is within the above-described range, an oxide thin film of few oxygen defects can be obtained. When there are many oxygen defects in the oxide thin film, absorption occurs in the visible light range and the thin film becomes colored, sub gap levels near the valence band increase, or the electron mobility decreases. In order to reduce oxygen defects, a small amount of oxygen may be mixed into the sputtering gas. Moreover, when the pressure of the sputtering gas is within the range of from 0.1 Pa to 5.0 Pa, the pressure of the sputtering gas is not too high, and thereby a sufficient film deposition rate can be obtained.

When the vacuum before the film deposition is insufficient and a water partial pressure in the vapor phase film deposition inside the chamber is high, Zn concentration in the thin film decreases. Therefore, the water partial pressure of the pressure inside the chamber before introducing the sputtering gas is preferably less than or equal to $3.0 \times 10^{-4}$ Pa, more preferably less than or equal to $3.0 \times 10^{-5}$ Pa, and further preferably less than or equal to $3.0 \times 10^{-6}$ Pa. In response to the above-described values, the pressure inside the chamber before introducing the sputtering gas is preferably less than or equal to $8.0 \times 10^{-4}$ Pa, more preferably less than or equal to $8.0 \times 10^{-5}$ Pa, and further preferably less than or equal to $8.0 \times 10^{-6}$ Pa.

An interval between the target and the film deposited substrate (T-S distance) is preferably from 2 cm to 20 cm, more preferably from 3 cm to 15 cm, and further preferably from 5 cm to 12 cm. When the distance is within the above-described range, because the T-S distance is not too small, a rise in temperature of the film deposited substrate can be prevented, and a thin film having a more uniform thickness can be obtained. Moreover, because the T-S distance is not too great, a sufficient film deposition rate can be obtained, and reductions in production efficiency can be avoided.

The sputtering gas that is used is not particularly limited. The sputtering gas may be an inactive gas or a rare gas. The sputtering gas may include oxygen. The inactive gas includes, for example, $N_2$ gas. Moreover, the rare gas includes He (helium), Ne (neon), Ar (argon), Kr (Krypton), and Xe (Xenon). Each of these gases may be used solely or in combination with another gas. Alternatively, the sputtering gas may be a reducible gas such as NO (nitrogen monoxide) or CO (carbon monoxide).

(Thin Film of ZTO)

In the embodiment of the present invention, there is provision for a thin film of a metal oxide (ZTO) including zinc (Zn), tin (Sn), and oxygen (O); and in terms of oxide, based on 100 mol % of total of the metal oxides, $SnO_2$ being greater than 15 mol % but less than or equal to 95 mol %, and substantially not including silicon (Si). When in terms of oxide based on 100 mol % of total of the metal oxides, $SnO_2$ is less than or equal to 15 mol %, crystallization temperature is low, and crystallization has a tendency to occur in a heat treatment step performed in various processes, and an amorphous state, a microcrystal state, or a mixed amorphous and microcrystal state cannot be maintained. When in terms of oxide based on 100 mol % of total of the metal oxides, $SnO_2$ is greater than 95 mol %, sintering is difficult, and a good oxide target cannot be obtained; in such a case, forming a thin film is difficult.

Here, not substantially including silicon (Si) refers to silicon (Si) not being included at all or, based on 100 mol % of total of the metal oxides, that $SiO_2$ may be included by 0.1 mol % or less as an impurity inevitably incorporated in manufacturing. Based on 100 mol % of total of the metal oxides, $SiO_2$ is preferably less than or equal to 0.05 mol %, and more preferably less than or equal to 0.02 mol %.

In ZTO, in terms of oxide based on 100 mol % of total of the metal oxide, $SnO_2$ is, for example, greater than or equal to 30 mol % but less than or equal to 70 mol %. In terms of oxide based on 100 mol % of total of the metal oxide, $SnO_2$ also may be, for example, greater than or equal to 35 mol % but less than or equal to 60 mol %, and is preferably greater than or equal to 40 mol % but less than or equal to 50 mol %.

The chemical formula of ZTO is preferably expressed by $xZnO \cdot (1-x)SnO_2$ (x is from 0.85 to 0.05). Here, x may be, for example, in a range from 0.30 to 0.70, and also may be in a range from 0.40 to 0.65. It is preferable that x is in a range from 0.50 to 0.60. ZTO is preferably in a form of a complex oxide.

The thin film of ZTO can be formed by using the same method as the above-described thin film of ZTSO. For example, the thin film of ZTO can be formed by performing a film deposition on a substrate by the vapor deposition method using a target including zinc (Zn), and tin (Sn).

When a single target is used, a fraction by numbers of atoms for Si/(Zn+Sn) in the target may be from 0.02 to 0.90, or may be from 0.05 to 0.85, or may be from 0.40 to 0.65, or may be from 0.50 to 0.60.

A composition analysis for the target can be performed by the XRF method or the like. The composition of the formed thin film of the metal oxide may be different from the composition ratio of the used target.

When a plurality of targets are used, for example, by simultaneously sputtering a target of metal Sn, and a target of ZnO, the thin film of ZTO according to the embodiment of the present invention can be obtained. Other combinations of the plurality of targets include, a combination of a target of ZnO, and a target of $SnO_2$; a combination of a plurality of targets including ZnO, and $SnO_2$ but with differing ratio of ZnO, and the like.

Also for performing the film deposition for the thin film of ZTO, the same sputtering gas as in the above-described case of ZTSO may be used.

(Characteristic of Thin Film of Metal Oxide or the Like)

The composition of the thin film of the above-described metal oxides (ZTO and ZTSO) can be analyzed by performing a substrate correction using EPMA when film thickness is greater than or equal to 200 nm. Further, the composition of the thin film of metal oxide can be analyzed by using SEM-EDX with acceleration voltage of 10 kV when film thickness is greater than or equal to 700 nm. Further, the composition of the thin film of metal oxide can be analyzed as well by using XRF method with a substrate correction. Further, when using ICP, the thin film of metal oxide can be analyzed by using a volume greater than or equal to 1 mm$^3$.

When the thin film of the metal oxide is amorphous, or when an amorphous state is dominant, the thin film has features such that a clear peak cannot be observed in X-ray diffraction and that crystallite diameter (Scherrer diameter) obtained by Scherrer's equation expressed by the following equation (1) is less than or equal to 5.2 nm. The lattice constant of ZnO (Wurtzite type) is a=0.33 nm and c=0.52 nm, and this means that the array of atoms in the crystallite is less than or equal to 16 lines. When the Scherrer constant is "K", the X-ray wavelength is "λ", the half band width is "β" and the peak position is "θ", the Scherrer diameter "L" is expressed as $$L = K\lambda/(\beta \cos \theta) \qquad \text{equation (1)}.$$

The Scherrer constant "K" is 0.9. The X-ray wavelength "λ" is 0.154 nm.

When the thin film of the metal oxide is amorphous, or when the amorphous state is dominant, the thin film of metal oxide has good flatness. The flatness can be measured by an atomic force microscope (AFM), and it is preferable in the invention that the root mean square (RMS) roughness for a measurement range of a 20 μm-wide <20×20 μm> square is less than or equal to 10 nm. It is more preferable that the root mean square roughness is less than or equal to 5 nm and furthermore preferably, less than or equal to 2 nm. When having such flatness, a chemical mechanical polishing (CMP) step can be omitted. If the RMS roughness for the measurement range of a 20 μm-wide square is greater than 10 nm, for example, as the bottom electrode and the top electrode of an organic electroluminescent device are in a localized manner closer to each other, short-circuiting has a tendency to occur. Thus, it is not preferable.

The electron mobility of the thin film of metal oxide may be $10^{-4}$ cm$^2 \cdot$V$^{-1}$ s$^{-1}$ to $10^2$ cm$^2 \cdot$V$^{-1}$ s$^{-1}$, may be $10^{-3}$ cm$^2 \cdot$V$^{-1}$ s$^{-1}$ to $10^2$ cm$^2 \cdot$V$^{-1}$ s$^{-1}$, or may be $10^{-2}$ cm$^2 \cdot$V$^{-1}$ s$^{-1}$ to $10^2$ cm$^2 \cdot$V$^{-1}$ s$^{-1}$.

The electron density of the thin film of metal oxide may be $1 \times 10^{14}$ cm$^{-3}$ to $1 \times 10^{19}$ cm$^{-3}$, may be $1 \times 10^{15}$ cm$^{-3}$ to $1 \times 10^{18}$ cm$^{-3}$, or may be $1 \times 10^{16}$ cm$^{-3}$ to $1 \times 10^{17}$ cm$^{-3}$.

The thin film of metal oxide having such electron mobility and electron density has high electrical conductivity and high electron transport capability. Thus, such a thin film of metal oxide is preferable for an electron transport capability film.

The electron mobility of the thin film of metal oxide may be obtained by Hall measurement method, Time-of-Flight (TOF) method or the like. The electron density of the thin film of metal oxide may be obtained by iodine titration method, Hall measurement method or the like.

The electron affinity of the thin film of metal oxide may be 2.0 eV to 4.0 eV, may be 2.2 eV to 3.5 eV, or may be 2.5 eV to 3.0 eV. When the electron affinity is greater than or equal to 2.0 eV, for when the thin film of metal oxide is used as a layer member of an organic electroluminescent device, for example, an electron injection characteristic of the thin film of metal oxide becomes good and the luminous efficiency of the organic electroluminescent device is improved. Further, when the electron affinity is less than or equal to 4.0 eV, sufficient light emission can be easily obtained from the organic electroluminescent device. In this way, the thin film of metal oxide is preferable for an electron transport capability film having an electron injection function as well.

The electron affinity (EA) of the thin film of metal oxide can be controlled by the composition of the film, and estimated by the following equation (2)

$$EA = 4.0 \times (ZnO) + 1.0 \times (SiO_2) + 4.7 \times (SnO_2) \qquad \text{equation (2)}.$$

Here, (ZnO), (SiO$_2$) and (SfO$_2$) are molar fractions of ZnO, SiO$_2$ and SnO$_2$, respectively.

In this way, because the electron affinity of the metal oxide is easily controlled, a potential barrier for various organic semiconductors having different lowest unoccupied molecular orbitals (LUMO) can be optimized. In an organic electroluminescent device, organic luminescent materials having different electron affinities are used for changing an emission wavelength. An organic luminescent material having great LUMO is used for emitting light of long wavelength such as red, and an organic luminescent material having small LUMO is used for emitting light of short wavelength such as blue. By optimizing the potential barrier, the luminous efficiency can be enhanced. Moreover, also in a photovoltaic cell, because an offset of the conduction band can be adjusted optionally, the conversion efficiency can be enhanced. Therefore, the photovoltaic cell may be an inorganic photovoltaic cell or an organic photovoltaic cell.

The ionization potential of the metal oxide may be 5.5 eV to 8.5 eV, may be 5.7 eV to 7.5 eV, or may be 5.9 eV to 7.0 eV. The thin film of metal oxide having such large ionization potential has a high hole blocking effect and is capable of selectively transporting only electrons. Thus, the thin film of metal oxide is preferable for an electron transport capability film having a hole blocking function as well.

The optical band gap of the metal oxide may be 2.7 eV to 5.5 eV, may be 2.8 eV to 4.5 eV, may be 3.1 eV to 4.0 eV, or may be 3.2 eV to 4.0 eV. The thin film of metal oxide having such greater optical band gap has a small light absorption coefficient in the visual light range, is transparent, and does not block light when used as an intermediate layer of a photoelectric conversion device. Thus, it is preferable.

The thickness of the thin film of metal oxide is not limited to the above, however, the thickness may be less than or equal to 2000 nm, may be less than or equal to 400 nm, or may be less than or equal to 200 nm. The thickness may be greater than or equal to 10 nm, may be greater than or equal to 70 nm, may be greater than or equal to 100 nm, or may be greater than or equal to 140 nm. When the thickness is greater than or equal to 10 nm, a pinhole does not tend to occur, and two thin film layers provided in contact with the thin film of metal oxide do not tend to short-circuit. Thus, the hole blocking function of the metal oxide or the electron transport capability acts effectively, and the characteristic of the device does not tend to degrade. Moreover, when the thickness is less than or equal to 2000 nm, the thin film does not require a long time for formation, and a preparation cost for the device is decreased.

The refraction index of the thin film of metal oxide may be 1.50 to 2.00, may be 1.60 to 1.95, or may be 1.70 to 1.90. An organic substance layer generally has a refraction index of 1.6 to 1.8, and thus the difference in refraction index with the thin film of metal oxide is small. Thus, an effect whereby loss by total reflection at an interface between the thin film of metal oxide and the organic substance layer is small, can be obtained.

The thin film of metal oxide may be singularly provided, or may be provided in a state of being formed on a substrate. For the latter case, the material of the substrate is not specifically limited. The substrate may be formed of a material such as a glass, for example, that does not have good heat-resistance at high temperatures exceeding 700° C.

The thin film of metal oxide according to the embodiment may be adapted to a layer member or the like for a photoelectric conversion device such as an organic electroluminescent device or a photovoltaic cell. For example, when the thin film of metal oxide is adapted to a layer necessary to have electron transport capability in the organic electroluminescent device or the photovoltaic cell, specifically, one or more layers selected from a group consisting of an electron transport layer, an electron injection layer and a hole blocking layer, it is possible to further increase the characteristic of an photoelectric conversion device. For example, a photoelectric conversion device with good stability and high reliability can be provided. Further, for the organic electroluminescent device, the luminous efficiency can be increased. Further, for the photovoltaic cell, the conversion efficiency can be increased.

The flatness of the thin film of metal oxide becomes likely to be enhanced, as the thin film is amorphous or an amorphous state is dominant in the thin film. Moreover, because a relation between the electron affinity and the composition is likely to have linearity, when the thin film is amorphous or an amorphous state is dominant in the thin film, a plurality of bands for the photoelectric conversion device tends to be easily selected. Furthermore, a homogeneous film tends to be obtainable when the thin film of metal oxide is amorphous or an amorphous state is dominant in the thin film. Because a microcrystal thin film of metal oxide is more likely to be oriented in the film thickness direction than an amorphous thin film, the electronic characteristic is likely to be enhanced when a microcrystal state is dominant.

(Organic Electroluminescent Device)

The thin film of metal oxide of the example of the invention may be used as a layer member of an organic electroluminescent device. The organic electroluminescent device of the example of the invention includes an anode and a cathode, which is a pair of electrodes, and a light emitting layer between the anode and the cathode. Further, the "thin film of metal oxide" is provided between the light emitting layer and the cathode. The "thin film of metal oxide" may be provided as one or more layers selected from an electron transport layer, an electron injection layer and a hole blocking layer.

This means that the organic electroluminescent device of the invention may be either of
a structure in which the thin film of metal oxide is provided as the electron transport layer;
a structure in which the thin film of metal oxide is provided as the electron injection layer;
a structure in which the thin film of metal oxide is provided as the hole blocking layer;
a structure in which the thin film of metal oxide is provided as both the electron transport layer and the electron injection layer;
a structure in which the thin film of metal oxide is provided as both the electron transport layer and the hole blocking layer; and
a structure in which the thin film of metal oxide is provided as all of the electron transport layer, the electron injection layer and the hole blocking layer.

The organic electroluminescent device of the invention may include the light emitting layer between the anode and the cathode, and may be of any of the following structures, for provision between the light emitting layer and the cathode, a structure in which the thin film of metal oxide is provided in contact with the cathode;
a structure in which the thin film of metal oxide is provided in contact with the light emitting layer;
a structure in which the thin film of metal oxide is provided in contact with the cathode and the light emitting layer; and
a structure in which the thin film of metal oxide is provided not in contact with the cathode and the light emitting layer. When the thin film of metal oxide is provided to be in contact with the light emitting layer, as the difference in refraction index between the thin film of metal oxide and the light emitting layer is small, an effect of minimizing loss by total reflection at an interface between the thin film of metal oxide and the light emitting layer can be obtained.

For the structure of the organic electroluminescent device of the invention, for example, the following (a) to (h) may be used.

(a) a cathode/a thin film of metal oxide/a light emitting layer/an anode;
(b) a cathode/an electron injection layer/a thin film of metal oxide/a light emitting layer/an anode;
(c) a cathode/an electron injection layer/a thin film of metal oxide/a hole blocking layer/a light emitting layer/an anode;
(d) a cathode/a thin film of metal oxide/a hole blocking layer/a light emitting layer/an anode;
(e) a cathode/a thin film of metal oxide/an electron transport layer/a light emitting layer/an anode;
(f) a cathode/a thin film of metal oxide/an electron transport layer/a hole blocking layer/a light emitting layer/an anode;
(g) a cathode/an electron transport layer/a thin film of metal oxide/a light emitting layer/an anode;
(h) a cathode/an electron injection layer/an electron transport layer/a thin film of metal oxide/a light emitting layer/an anode;

Here, the above-described device structures are just examples, and the structure of the organic electroluminescent device of the invention is not limited so. Further, one or more layers selected from a group consisting of a hole injection layer, a hole transport layer and an electron blocking layer may be provided between the anode and the light emitting layer in this order from an anode side.

Hereinafter, an example of the organic electroluminescent device of the invention (hereinafter, referred to as an "organic EL device" as well) is described with reference to drawings. FIG. 1 illustrates a schematic cross-sectional view of an organic EL device of the example of the invention. FIG. 1 illustrates an example having the above-described device structure of (c) and further including the hole injection layer, the hole transport layer and the electron blocking layer.

As illustrated in FIG. 1, the organic electroluminescent device 100 (organic EL device 100) of the embodiment is configured by stacking a cathode 120, an electron injection layer 130, an electron transport layer 140, a hole blocking layer 145, a light emitting layer 150, an electron blocking layer 155, a hole transport layer 160, a hole injection layer 170 and an anode 180 on a substrate 110 in this order.

However, one or more layers selected from a group consisting of the hole injection layer 170, the hole transport layer 160, the electron blocking layer 155, the hole blocking layer 145 and the electron injection layer 130 may be omitted.

The organic EL device 100 of the example of the present invention has a characteristic that the electron transport layer 140 is formed of the "thin film of metal oxide".

Generally, the electron transport layer 140 is formed of an organic substance such as Tris(8-quinolinolato)aluminum (Alq3). However, an organic substance such as Alq3 has relatively low electron mobility and does not have good electrical conductivity. Thus, in order to use this material as the electron transport layer, it is necessary to make it thin in order to ensure sufficient electron transport capability. However, if such a layer is made thin, the above-described optical loss is generated by the Evanescent light (near-field light) and the surface plasmon at a surface of a metal electrode. This loss by plasmon becomes larger as the distance between the light emitting portion and the electrode is shorter, and the loss is about 70% when the distance is 30 nm and about 30% when the distance is 50 nm. This means that if the distance between the light emitting portion and the metal electrode is 30 nm, 70% of the light generated at the light emitting portion is absorbed by the plasmon. Further, if such a layer is made thin, there is a risk that a layered thin film cannot be obtained. On the other hand, if the layer is made thick, sufficient electrical conductivity cannot be obtained, and there is a risk that the electron transport capability is insufficient, and that the voltage necessary for the light emission of the organic EL device increases.

Further, an organic substance such as Alq3 has relatively poor stability, and there is a problem that it easily deteriorates when contacting the air. Thus, it is necessary for an electron transport layer made of Alq3 to be handled under a controlled environment, and as a result, there is a risk that the manufacturing process becomes complicated.

Further, an organic substance such as Alq3 has a characteristic that its mobility of holes is relatively high. Thus, when an electron transport layer made of Alq3 is used, holes that do not recombine with electrons in the light emitting layer 150 pass through the electron transport layer 140 to reach the cathode 120, and there is a risk that the luminous efficiency is lowered.

As such, if the electron transport layer does not have sufficient electrical conductivity, if the electron transport layer is degraded, or if holes pass through the electron transport layer, there is a possibility that the organic EL device does not have the desired light-emission characteristic, or reliability of the organic EL device is lowered.

On the other hand, according to the organic EL device 100 of the example of the invention, the thin film of metal oxide is provided as the electron transport layer 140. The thin film of metal oxide has good electrical conductivity. Thus, when the thin film of metal oxide is used as the electron transport layer 140, it is unnecessary for the thickness of the layer to be about 50 nm, such as for conventional Alq3.

Further, as the thin film of metal oxide is formed of a stable inorganic material, the thin film of metal oxide is not deteriorated or degraded even by contacting the air. Thus, a problem such as a need to handle under a controlled environment and a complicated manufacturing process, as in a conventional electron transport layer made of Alq3, can be solved.

Further, the thin film of metal oxide has good electron affinity for moderating the electron injection barrier from the cathode 120 to the light emitting layer 150. Thus, according to the present invention, an organic EL device with high luminous efficiency can be obtained.

In addition, the thin film of metal oxide has a characteristic of large ionization potential. Thus, the thin film of metal oxide has a so-called hole blocking effect. This means that the thin film of metal oxide can prevent holes that are not recombined with electrons in the light emitting layer 150 from passing through the electron transport layer 140 and reaching the cathode 120 to thereby increase the probability of the electrons and the holes being recombined. Thus, according to the present invention, an organic EL device with high luminous efficiency can be obtained.

By providing the thin film of metal oxide as the electron transport layer 140, an organic EL device easy to be handled with high reliability can be provided.

Here, generally, in order to manufacture organic devices, such as organic EL devices, stably and inexpensively, an amorphous thin film that is excellent in flatness and homogeneity is preferably used for an electron transport layer. However, the conventional amorphous thin film has a problem of crystallization occurring in a heat treatment and deterioration of the thin film during the manufacturing process for organic devices.

However, the thin film of metal oxide according to the embodiment has a relatively high crystallization temperature, and thereby the problem of deterioration of the thin film by the heat treatment in the manufacturing process for organic devices, as in the case of conventional amorphous thin film, can be solved significantly. Therefore, when the thin film of metal oxide according to the embodiment is employed, the flatness and the homogeneity for the electron transport layer can be maintained even after the organic devices are manufactured.

From these viewpoints, in the thin film of ZTO, in terms of oxide based on 100 mol % of total of the metal oxide, $SnO_2$ is preferably greater than or equal to 40 mol % but less than or equal to 60 mol %, and is more preferably greater than or equal to 45 mol % but less than or equal to 55 mol %.

Similarly, in the thin film of ZTSO, in terms of oxide based on 100 mol % of total of the metal oxide, $SnO_2$ is preferably greater than or equal to 7 mol %, is more preferably greater than or equal to 8 mol %, and is further preferably greater than or equal to 10 mol %.

Moreover, in order to improve the productivity of the organic devices, electron transport layers that are excellent in patterning property and have great deposition rates are preferably used.

Regarding these properties, the thin films of metal oxide (thin film of ZTO and thin film of ZTSO) according to the embodiment have great deposition rates and are excellent in etching characteristic. Particularly, when the thin film of metal oxide is formed by using the sputtering method, a target having a composition suitable for a sputtering gas to be used can be selected from a metal or an oxide, and thereby a great deposition rate can be obtained. Moreover, good etching characteristic for the thin film of metal oxide according to the embodiment can be obtained by controlling the composition in any of dry etching and wet etching.

ZTSO has a higher crystallization temperature than ZTO, and is not easily crystallized in heat treatments performed in various processes, and is relatively likely to maintain the amorphous state. Moreover, in ZTSO, the electron affinity tends to be higher than in ZTO, and thereby ZTSO is relatively suitable for electron injection to an organic semiconductor and for electron transport. In ZTO, the electrical conductivity tends to be higher than in ZTSO, and an increase in voltage of the device is small even if the layers are stacked thickly. Therefore, when ZTO is used in organic EL devices, optical loss generated by the Evanescent light (near-field light) and the surface plasmon is likely to be reduced.

Next, a structure of each of the layers that constitute the organic EL device 100 illustrated in FIG. 1 is described more detail.

(Substrate 110)

The substrate 110 from its upper portion has a function to support layers that constitute the organic EL device 100. The material of the substrate 110 is not specifically limited. In FIG. 1, when a light extraction surface of the organic EL device 100 is positioned at a lower side (in other words, at a substrate 110 side), the substrate 110 is formed of a transparent material. As the substrate 110, a glass substrate, a plastic substrate or the like is used, for example.

(Cathode 120)

The cathode 120 is generally formed of metal. Here, when the light extraction surface of the organic EL device 100 is positioned at the lower side (in other words, at the substrate 110 side), the cathode 120 is formed of a transparent material. As the cathode 120, a transparent thin film of metal oxide such as ITO (indium tin oxide) is used, for example.

The cathode 120 may be a metal material such as aluminum, silver, gold, magnesium, calcium, titanium, yttrium, lithium, gadolinium, ytterbium, ruthenium, manganese, molybdenum, vanadium, chromium, tantalum, or an alloy of the above-described metals, for example. Alternatively, the cathode 120 may be metal oxide such as ITO, antimony oxide ($Sb_2O_3$), zirconium oxide ($ZrO_2$), tin oxide ($SnO_2$), zinc oxide (ZnO), IZO (Indium Zinc Oxide), AZO (ZnO—$Al_2O_3$: aluminum doped zinc oxide), GZO (ZnO—$Ga_2O_3$: gallium doped zinc oxide), Nb doped $TiO_2$, Ta doped $TiO_2$, IWZO ($In_2O_3$—$WO_3$—ZnO: tungstic trioxide and zinc oxide doped indium oxide) or the like, for example.

The deposition method of the cathode 120 is not specifically limited. The cathode 120 may be deposited by vapor deposition (vacuum vapor deposition, electron beam vapor deposition), ion plating, laser ablation, a sputtering method or the like.

Typically, the thickness of the cathode 120 is within a range of 50 nm to 150 nm. It is preferable that the thickness of the cathode 120 is within a range of 2 nm to 50 nm when the metal material is used as the transparent electrode.

(Electron Injection Layer 130)

The electron injection layer 130 is selected from a material having an electron injection function. The electron injection layer 130 may be one or more selected from a group consisting of lithium fluoride, cesium carbonate, sodium chloride, cesium fluoride, lithium oxide, barium oxide, barium carbonate and (8-quinolinolato)lithium.

The electron injection layer 130 may be formed by a thin film of amorphous oxide electride containing calcium atoms and aluminum atoms.

Here, the "amorphous oxide electride" means an amorphous solid material formed of solvation in which amorphous material composed of calcium atoms, aluminum atoms and oxygen atoms is solvent and electrons are solutes. The electrons in the amorphous oxide function as anions. The electrons may exist as bipolarons.

The bipolarons are configured by two adjacent cages with an electron (solute) being included in each of the cages. However, the state of the amorphous oxide electride is not limited to the above, and two electrons (solutes) may be included in a cage. Moreover, the amorphous oxide electride may be in a state in which the plurality of cages are aggregated. As the aggregated cages may be regarded as microcrystals, a state in which microcrystals are included in the amorphous material is also regarded as an amorphous material.

It is preferable that the molar ratio (Ca/Al) of aluminum atoms to calcium atoms in the thin film of amorphous oxide electride is within a range of 0.3 to 5.0, more preferably, within a range of 0.55 to 1.00, further preferably, within a range of 0.8 to 0.9, and especially preferably, within a range of 0.84 to 0.86.

The composition of the "amorphous oxide electride" is preferably $12CaO \cdot 7Al_2O_3$. However, the composition is not limited to this, but includes, for example, the compounds (1) to (4) as follows:

(1) Same type compound in which a part or whole of Ca atoms are replaced by metallic atoms such as Sr, Mg and/or Ba. For example, the compound, in which a part or whole of Ca atoms is replaced by Sr, includes strontium aluminate $Sr_{12}Al_{14}O_{33}$. A mixed crystal in which a mixing ratio of Ca to Sr is optionally valid includes calcium strontium aluminate $Ca_{12-x}Sr_xAl_{14}O_{33}$ (x is an integer of 1 to 11; an average of x is greater than 0 but less than 12).

(2) Same type compound in which a part or whole of Al atoms is replaced by one or more atoms selected from a group consisting of Si, Ge, Ga, In, and B. For example, the compound includes $Ca_{12}Al_{10}Si_4O_{35}$.

(3) Same type compound in which a part of metallic atoms and/or non-metallic atoms (except for oxygen atoms) in $12CaO \cdot 7Al_2O_3$ (including the above-described compounds (1) and (2)) is replaced by one or more transition metal atoms or typical metallic atoms selected from a group consisting of Ti, V, Cr, Mn, Fe, Co, Ni and Cu; one or more alkali metallic atoms selected from a group consisting of Li, Na, and K; or one or more rare-earth atoms selected from a group consisting of Ce, Pr, Nd, Sm, Eu, Gd, Tb, Dy, Ho, Er, Tm, and Yb.

(4) Compound in which a part or whole of free oxygen ions included in cages is replaced by other anions. The other anions include, for example, anions such as $H^-$, $H_2^-$, $H^{2-}$, $O^-$, $O_2^-$, $OH^-$, $F^-$, $Cl^-$, and $S^{2-}$, or an anion of nitrogen (N) or the like.

(5) Compound in which a part of oxygen atoms of a cage structure is replaced by nitrogen (N) atoms or the like.

Although the deposition method of the electron injection layer 130 is not specifically limited, the electron injection layer 130 may be deposited by vapor deposition. For example, an electron injection material may be heated under a vacuum of $10^{-3}$ Pa to $10^{-7}$ Pa to be vapor deposited. Further, the electron injection layer 130 may be deposited by a sputtering method or the like.

It is preferable that the thickness of the electron injection layer 130 is generally 0.5 nm to 2.0 nm. This is because if the electron injection layer 130 is too thin, the electron injection effect becomes small and if the electron injection layer 130 is too thick, the volume resistivity becomes high. Note that the electron injection layer 130 may also be omitted.

(Electron Transport Layer 140)

As described above, the thin film of metal oxide is used in the electron transport layer 140 in the organic EL device 100.

As described above, the electron transport layer 140 composed of the thin film of metal oxide has good electron mobility. This electron mobility is higher by a few orders of magnitude compared with an organic electron transport layer made of Alq3 that is used for a conventional electron transport layer. By using the thin film of metal oxide, even when the electron transport layer 140 is made to be thicker, the voltage necessary for the light emission of the organic EL device does not easily increase. Thus, the electron transport layer 140 can be made of a thickness that is difficult for an organic electron transport layer.

The thickness of the electron transport layer 140 composed of the thin film of metal oxide may be, for example, 70 nm to 2000 nm, preferably, 100 nm to 1500 nm, more preferably, 200 nm to 1000 nm and furthermore preferably, 300 nm to 500 nm. By making the electron transport layer 140 to have such a thickness, the above-described optical loss due to plasmon can be reduced, and the external quantum efficiency can be improved by improving the light extracting efficiency through optical design. Further, compared with a case when the electron transport layer made of an organic substance is used, it is possible to suppress a short circuit of the organic EL device. With this, reliability or yield of the organic EL device can be improved. Although this effect of suppressing the short circuit of the organic EL device is effective for a display such as an active matrix composed of fine pixels, in particular, it is significantly effective for illumination with larger pixels. Further, by making the electron transport layer 140 to be the above-described thickness, the manufacturing cost can be suppressed because the thin film can be manufactured within a short period. The electron transport layer 140 may be deposited by the above-described deposition method.

(Hole Blocking Layer 145)

The hole blocking layer 145 is selected from a material having a hole blocking function. The hole blocking layer may be a material with a high HOMO (highest orbital molecular orbital) level, or the like, for example. Alternatively, the hole blocking layer may be inorganic oxide, metal oxide or the like. For example, IGZO (In—Ga—Zn—O), ITO (In—Sn—O), ISZO (In—Si—Zn—O), IGO (In—Ga—O), ITZO (In—Sn—Zn—O), IZO (In—Zn—O), IHZO (In—Hf—Zn—O) or the like may be used.

Note that the hole blocking layer 145 may also be omitted.

(Light Emitting Layer 150)

The light emitting layer 150 may be made of any known luminescent materials for an organic EL device. The light emitting layer 150 may be epidorisin, 2,5-bis[5,7-di-t-pentyl-2-benzoxazolyl]thiophene, 2,2'-(1,4-phenylenedivinylene)bisbenzothiazole, 2,2'-(4,4'-biphenylene)bisbenzothiazole, 5-methyl-2-[2-[4-(5-methyl-2-benzoxazolyl)phenyl]vinyl]benzoxazole, 2,5-bis(5-methyl-2-benzoxazolyl)thiophene, anthracene, naphthalene, phenanthrene, pyrene, chrysene, perylene, perinone, 1,4-diphenyl butadiene, tetraphenyl butadiene, coumarin, acridine, stilbene, 2-(4-biphenyl)-6-phenylbenzoxazole, aluminum trisoxine, magnesium bisoxine, bis(benzo-8-quinolinol) zinc, bis(2-methyl-8-quinolinolalto)aluminum oxide, indium trisoxine, aluminum tris(5-methyloxine), oxine lithium, gallium trisoxine, calcium bis(5-chloro-oxine), polyzinc-bis(8-hydroxy-5-quinolinolyl)methane, dilithium epindolidione, zinc bisoxine, 1,2-phthaloperinone, 1,2-naphthaloperinone or the like, for example.

The light emitting layer 150 may be deposited by a dry process such as vapor deposition, transfer printing or the like. Alternatively, the light emitting layer 150 may be deposited by a wet process such as spin coating, spray coating, gravure printing or the like.

Typically, the thickness of the light emitting layer 150 is within a range of 1 nm to 100 nm. Further, the hole transport layer may also function as the light emitting layer.

(Electron Blocking Layer 155)

The electron blocking layer 155 is selected from a material having an electron blocking function.

The electron blocking layer 155 may be an organic material, for example, a material with low LUMO level. For example, Tris(phenylpyrazole)iridium (Ir(ppz)3) or the like may be used.

(Hole Transport Layer 160)

The hole transport layer 160 is selected from a material having a hole transport function.

The hole transport layer 160 may be an arylamine based compound, an amine compound containing a carbazole group, an amine compound containing a fluorine derivative or the like, for example. Specifically, the hole transport layer 160 may be 4,4"-Bis[N-(naphtyl)-N-phenylamino]biphenyl (α-NPD), N,N'-Bis(3-methylphenyl)-(1,1'-biphenyl)-4,4'-diamine (TPD), 2-TNATA, 4,4',4"-Tris(N-(3-methylphenyl) N-phenylamino) triphenyl amine (MTDATA), 4,4'-N,N'-dicarbazole biphenyl (CBP), Spiro-NPD, spiro-TPD, spiro-TAD, TNB or the like.

The hole transport layer 160 may be deposited by a conventionally known general deposition process.

Typically, the thickness of the hole transport layer 160 is within a range of 1 nm to 100 nm.

Note that the hole transport layer 160 may also be omitted.

(Hole Injection Layer 170)

The hole injection layer 170 is selected from a material having a hole injection function.

The hole injection layer 170 may be an organic substance, such as CuPc, starburst amine and the like, for example. Alternatively, the hole injection layer 170 may be metal oxide such as an oxide material containing one or more metals selected from a group consisting of molybdenum, tungsten, rhenium, vanadium, indium, tin, zinc, gallium, titanium and aluminum, for example.

Generally, when a top electrode formed on an organic substance layer is deposited by a sputtering method, it is known that a characteristic of the organic EL device is degraded due to sputtering damage to the organic substance layer. As metal oxide has higher resistance to sputtering compared to the organic substance, by depositing the metal oxide layer on the organic substance layer, sputtering damage to the organic substance layer can be reduced.

The deposition method of the hole injection layer 170 is not specifically limited. The hole injection layer 170 may be deposited by a dry process such as vapor deposition, transfer printing or the like. Alternatively, the hole injection layer 170 may be deposited by a wet process such as spin coating, spray coating, gravure printing or the like.

Typically, the thickness of the hole injection layer 170 is within a range of 1 nm to 50 nm. Note that the hole injection layer 170 may also be omitted.

(Anode 180)

As the anode 180, generally, a metal or metal oxide is used. The material used for the anode 180 preferably has a work function greater than or equal to 4 eV. When the light extraction surface of the organic EL device 100 is arranged to be at the anode 180 side, the anode 180 needs to be transparent.

The anode 180 may be a metal material such as aluminum, silver, tin, gold, carbon, iron, cobalt, nickel, copper, zinc, tungsten, vanadium, or an alloy of the above-described metals, for example. Alternatively, the anode 180 may be metal oxide such as ITO, antimony oxide ($Sb_2O_3$), zirconium oxide ($ZrO_2$), tin oxide ($SnO_2$), zinc oxide (ZnO), IZO (Indium Zinc Oxide), AZO (ZnO—$Al_2O_3$: aluminum doped zinc oxide), GZO (ZnO—$Ga_2O_3$: gallium doped zinc oxide), Nb doped $TiO_2$, Ta doped $TiO_2$, IWZO ($In_2O_3$—$WO_3$—

ZnO: In$_2$O$_3$—WO$_3$—ZnO: tungstic trioxide and zinc oxide doped indium oxide) or the like, for example.

The deposition method of the anode 180 is not specifically limited. The anode 180 may be formed by a known deposition technique such as vapor deposition, a sputtering method, coating or the like.

Typically, the thickness of the anode 180 is within a range of 50 nm to 150 nm. In the case of using a metal material for a transparent electrode, it is preferable that the thickness of the anode 180 is within a range of 2 nm to 50 nm.

Here, for the example of FIG. 1, a structure of the organic EL device is described by exemplifying a case in which the cathode 120 is provided closer to the substrate 110 and the anode 180 is provided further from the substrate 110.

However, according to the present invention, the structure of the organic EL device is not limited as such. For example, opposite from the structure of FIG. 1, the anode 180 may be provided closer to the substrate 110 and the cathode 120 may be provided further from the substrate 110. In such a case, the organic EL device has a structure in which the layers 120 to 180 except the substrate 110 of FIG. 1 are reversed from top to bottom.

Generally, in the organic EL device, each layer (hereinafter referred to as an "organic layer") provided between the cathode and the anode has a tendency that its characteristic deteriorates due to environmental components such as moisture or the like. Thus, it is preferable that the organic layer is insulated from environmental factors such as moisture or the like. Further, as the organic layer is relatively weak against physical contact, it is preferable to increase mechanical strength.

In this regard, according to the organic EL device of the embodiment of the invention, the surface of the organic layer can be stabilized (passivation) by the thin film of metal oxide which has good chemical durability. Further, the organic layer can be physically protected as well by the thin film of metal oxide which has good mechanical strength.

For example, according to the structure of the organic EL device 100 as illustrated in FIG. 1, the cathode 120 and the electron injection layer 130 can be chemically and physically protected by the thin film of metal oxide, which is used for the electron transport layer 140. Further, for example, for a structure in which the layers 120 to 180 except the substrate 110 of FIG. 1 are reversed from top to bottom, each layer from the hole blocking layer 145 to the anode 180 can be chemically and physically protected by the thin film of metal oxide.

According to the embodiment of the present invention, with these effects, it is possible to easily transfer a semifabricated product in the open air while manufacturing the organic EL device, and the manufacturing of the organic EL device is simplified.

The organic EL device of the invention may be of either of the following structures.
  (1) a structure including a substrate, a cathode and an anode in this order, in which a substrate side is a light extracting surface;
  (2) a structure including a substrate, a cathode and an anode in this order, in which an anode side is a light extracting surface;
  (3) a structure including a substrate, an anode and a cathode in this order, in which a substrate side is a light extracting surface; and
  (4) a structure including a substrate, an anode and a cathode in this order, in which a cathode side is a light extracting surface.

When considering an aperture ratio, it is preferable that the organic EL device of the invention has either of the above-described structures (2) and (4). Further, when considering luminance stability of the organic EL device, it is preferable that the organic EL device of the invention has the above-described structure (1) or (2).

For another example of the organic EL device of the invention, the organic EL device 100 may have a structure in which the thin film of metal oxide is provided as the electron injection layer 130. As the thin film of metal oxide has good electron affinity for moderating the electron injection barrier from the cathode 120 to the light emitting layer 150, the thin film of metal oxide can preferably function as the electron injection layer.

Further, for another example of the organic EL device of the invention, the organic EL device 100 may include the thin film of metal oxide as the hole blocking layer 145. The thin film of metal oxide can preferably function as the hole blocking layer as its hole blocking effect is high and has large ionization potential.

Note that when the thin film of metal oxide is not provided as the electron transport layer 140 in the organic EL device 100, the electron transport layer 140 may be formed of another material having electron transport capability. As the material having electron transport capability, Tris(8-quinolinolato)aluminum (Alq3), Bathocuproine (BCP), Bis(2-methyl-8-quinolinolate)-4-(phenylphenolato)aluminium (BAlq) may be used, for example. Alternatively, an electron transport layer that is also used as the light emitting layer may be provided.

Generally, the chemical stabilities of the cathode and the electron injection layer, whose work functions are low, are poor, with respect to each of the materials composing the organic EL device. Thus, when the organic EL device is used for a long period, deterioration of the cathode and the electron injection layer due to a chemical reaction such as oxidation or the like determines the long term stability of the organic EL device itself. Thus, by covering the cathode and the electron injection layer by the electron transport layer formed of the thin film of metal oxide that is chemically stable and has low gas permeability, as in the organic EL device of the invention, an effect that the lifetime of the organic EL device is extended can be obtained, as compared with a case when an organic substance such as Alq3 is used.

Note that the organic EL device of the invention may have a structure in which the electron injection layer, which is the thin film of amorphous oxide electride containing calcium atoms and aluminum atoms, or the cathode is not provided.

(Photovoltaic Cell)

The above-described "thin film of metal oxide" of the invention may be used as a layer member of a photovoltaic cell. The photovoltaic cell includes a pair of electrodes and a photoelectric conversion layer between the pair of electrodes. The pair of electrodes includes an electrode for extracting electrons and an electrode for extracting holes. In the photovoltaic cell of the invention, the "thin film of metal oxide" is provided between the photoelectric conversion layer and the electrode for extracting electrons.

The structure of the photovoltaic cell of the invention may be (a) to (h) as explained above for the organic EL device, and may be the structure of the organic EL device 100 of FIG. 1. The electrode for extracting holes of the photovoltaic cell may be read as the anode of the organic EL device. The electrode for extracting electrons of the photovoltaic cell may be read as the cathode of the organic EL device. The photoelectric conversion layer of the photovoltaic cell may be read as the light emitting layer of the organic EL device.

By providing the thin film of metal oxide between the photoelectric conversion layer and the cathode, a photovoltaic cell with good stability and high reliability can be provided. Moreover, the conversion efficiency can be improved. The metal oxide has the feature, as described above, that the electron affinity can be controlled by the film composition in the relatively low range of 2.0 eV to 4.0 eV. Because the electron affinity is relatively low, the open voltage of the photovoltaic cell can easily become high, and it is possible to easily make the conversion efficiency high. The conversion efficiency (%) can be obtained by dividing the product of the short-circuit current, the open voltage and the fill factor by the intensity of incident light. Here, the short-circuit current is a current value when the electric voltage is zero V, the open voltage is a voltage value when the electric current is zero A, and the fill factor is a ratio of the maximum output to the product of the open voltage and the short-circuit current.

Moreover, because the electron affinity can be controlled by the film composition, the conduction band offset can be easily adjusted for various photoelectric conversion layers. When the conduction band offset is too great, it becomes a barrier to a flow of electrons, and an internal resistance of the photovoltaic cell increases. As a result, the fill factor decreases and the conversion efficiency decreases. When the conduction band offset is too small, because recombination cannot be inhibited, the short-circuit current decreases and the conversion efficiency decreases.

The photoelectric conversion layer is not particularly limited, but may be a compound based material such as Cu—In—Se, Cu—In—Ga—Se, Cd—Te, or Ga—As, or a Si crystal or an amorphous Si of Si-based material, or an organic substance-based material.

EXAMPLES

Hereinafter, examples of the embodiment of the present invention will be described.

In each example, a sample in which a thin film of metal oxide was deposited on a substrate by one of the following methods was fabricated and evaluated for its characteristics.

Example 1

A Thin Film of ZTSO Deposited by a Sputtering Method.
(Sputtering Condition)

As a deposition apparatus, an RF magnetron sputtering apparatus (manufactured by Eiko Co., Ltd.) is used. As a sputtering target, a sintered body target with a diameter of 3 inches including 45% of ZnO, 45% of $SnO_2$, and 10% of $SiO_2$, in mol % in terms of an oxide, was used.

First, a quartz substrate which was optically polished and has a thickness of 1 mm was introduced in a chamber of the sputtering apparatus. After reducing the pressure in the chamber of the sputtering apparatus to $2 \times 10^{-6}$ Pa or less, a mixed gas of argon (Ar) and oxygen ($O_2$) was introduced in the chamber as the sputtering gas. For the argon (Ar) gas, argon gas of G1 grade (purity 99.99995 vol. %) was used, and the flow rate was 19.9 scam. For the oxygen gas, oxygen gas of G1 grade (purity 99.99995 vol. %) was used, and the flow rate was 0.1 scam.

Afterwards, the pressure in the chamber of the sputtering apparatus was set to 0.4 Pa, an RF electric power 100 W was applied to a cathode, to generate plasma, and the deposition was performed for 8 minutes. A distance between the target and the quartz substrate was set to 10 cm. Then, a thin film of metal oxide having a thickness of 125 nm was obtained. The thickness was measured by an XRR (X-Ray Reflectivity) method.

(Evaluation: X-Ray Diffraction)

An X-ray diffraction spectrum for the thin film of metal oxide obtained as above was measured by a Seemann Bohlin technique. The Seemann Bohlin technique is described in Bulletin of the Japan Institute of Metals Vol. 27(1988) No. 6, pages 461 to 465. Here, the diffraction pattern was obtained by irradiating the electron beam on Cu under a condition of an acceleration voltage of 45 kV and a discharging current of 200 mA, and irradiating the generated CuKα rays on the sample while fixing the incident angle to be 0.5°.

Figure 2:
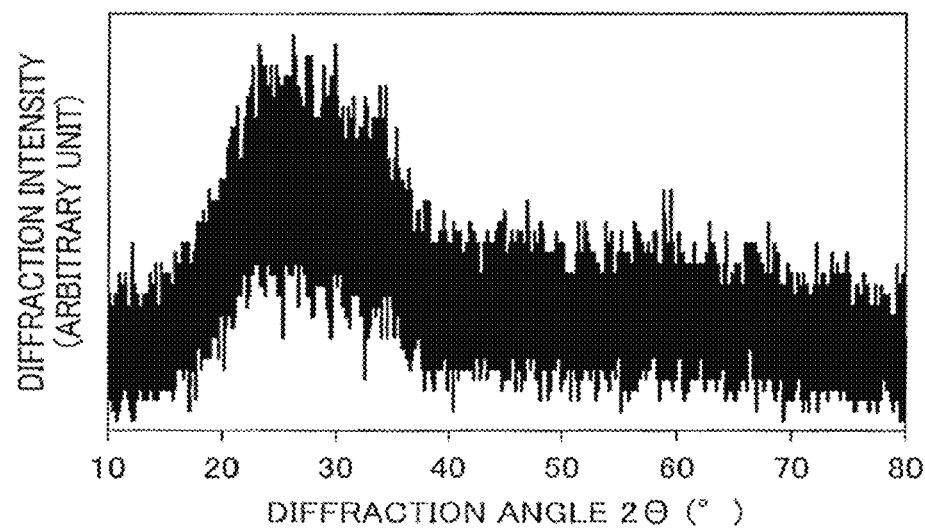
FIG. 2 illustrates a diffraction pattern of a thin film of ZTSO (zinc-tin-silicon-oxide) obtained in Example 1.

FIG. 2 illustrates obtained diffraction patterns. The ordinate axis represents a diffraction intensity (arbitrary unit), and the abscissa axis represents a diffraction angle 2θ(°). The diffraction pattern was a halo pattern. According to the results, it was found that the thin film, obtained as above, was amorphous by X-ray diffraction analysis or a state of amorphous substance was dominant.

(Evaluation: Optical Absorption Characteristic)

A reflection rate and a transmission rate of the obtained thin film were measured, and the optical absorption characteristic was evaluated.

Figure 3:
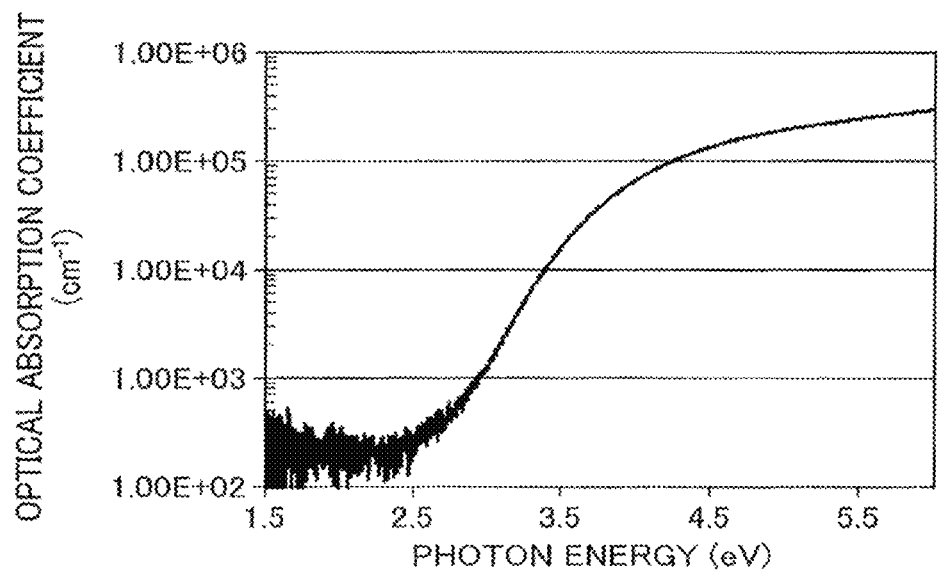
FIG. 3 illustrates an optical absorption characteristic of the thin film of the ZTSO obtained in Example 1.

FIG. 3 is a graph illustrating the optical absorption characteristic for the thin film. Moreover, FIG. 4 is a graph illustrating a Tauc plot for the thin film.

Figure 4:
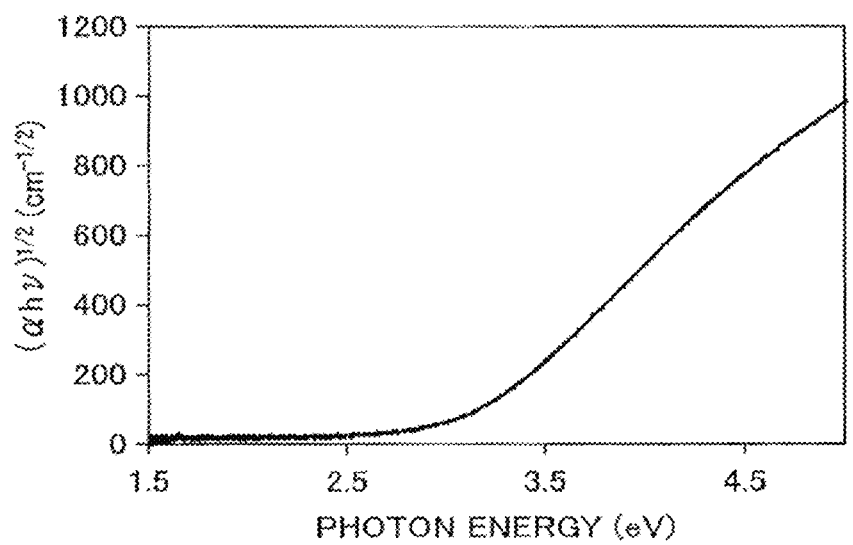
FIG. 4 illustrates a Tauc plot of the thin film of the ZTSO obtained in Example 1.

Furthermore, from the obtained Tauc plot for the optical absorption coefficient illustrated in FIG. 4, an optical band gap was obtained. The obtained optical band gap of the thin film was 3.1 eV.

Example 2

Thin Film of ZTSO Deposited by a PLD (Pulsed Laser Deposition) Method

Mixed powder of ZnO—$SnO_2$—$SiO_2$ that was casted was calcined (at 1300° C., for 5 hours, in air), and a target was fabricated. As targets, two kinds of targets with different compositions were used.

Using the above-described targets, by the PLD method (KrF excimer laser: wavelength 248 nm), a thin film of ZTSO was deposited on the quartz substrate, which was optically polished and had a thickness of 1 mm. Specifically, the quartz substrate was arranged in a vacuum chamber, air was exhausted to $3 \times 10^{-6}$ Pa, oxygen was introduced in the vacuum chamber, and the deposition was performed in surroundings of pressure at 5.0 Pa. Then, thin films of metal oxide having thickness of 150 nm were obtained for the respective targets.

By a XRF method, compositions of the obtained two kinds of thin films of ZTSO were confirmed. The compositions thereof were, in molar ratios, Zn:Sn:Si=45:45:10 and Zn:Sn:Si=47.5:47.5:5.

(Evaluation: Optical Absorption Characteristic)

A reflection rate and a transmission rate of the obtained thin films were measured, and the optical absorption characteristic was evaluated.

Figure 5:
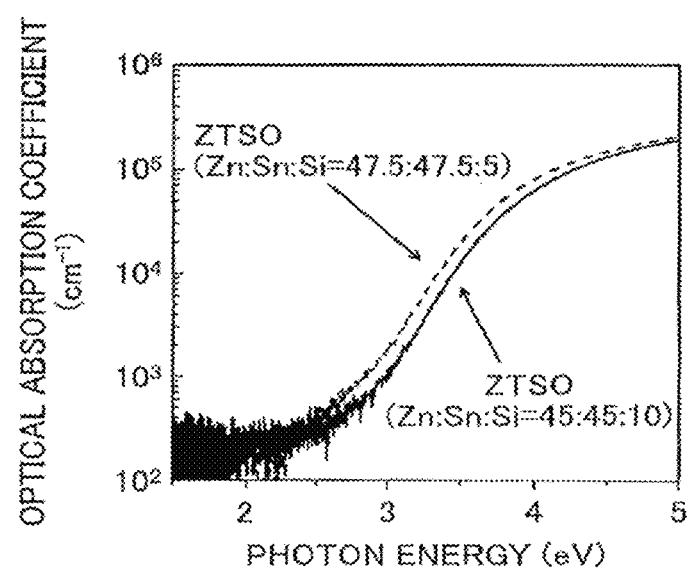
FIG. 5 illustrates an optical absorption characteristic of a thin film of ZTSO obtained in Example 2.

FIG. 5 illustrates the optical absorption characteristic of the thin films. The thin films were found to be transparent in a visible range. Furthermore, an optical band gap was obtained from a Tauc plot of the obtained optical absorption characteristic. As a result, the optical band gap of the thin film having the composition of Zn:Sn:Si=45:45:10 was 3.1 eV, and the optical band gap of the thin film having the composition of Zn:Sn:Si=47.5:47.5:5 was 3.2 eV.

(Evaluation: Hall Effect Measurement)

An electron density and an electron mobility were measured by a Hall effect measurement method for one of the obtained thin films (thin film having the composition of Zn:Sn:Si=45:45:10). Electrodes, with laminations of Ti having thickness of 10 nm and Au having thickness of 100 nm, were deposited at 6 mm intervals on the thin film of metal oxide by EB vapor deposition. For measurement results, the electron density of the thin film was $1.6 \times 10^{16}$ $cm^{-3}$, and the electron mobility was 3.8 $cm^2V^{-1}s^{-1}$.

Example 3

Thin Film of ZTO Deposited by the PLD Method

Mixed powder of $ZnO$—$SnO_2$ that was casted was calcined at 1300° C., for 5 hours in air, and target was fabricated. As targets, six kinds of targets with different compositions were used.

Using the above-described targets, by the PLD method (KrF excimer laser: wavelength 240 nm), a thin film of ZTO was deposited on the quarts substrate, which was optically polished and had a thickness of 1 mm. Specifically, the quartz substrate was arranged in the vacuum chamber, air was exhausted to $3 \times 10^{-6}$ Pa, oxygen was introduced in the vacuum chamber, and the position was performed in surrounding of pressure at 5.0 Pa. Then, thin films of metal oxide having thickness of 150 nm were obtained for the respective targets.

By the XRF method, compositions of the respective thin films were evaluated. In the chemical formula $xZnO \cdot (100-x)SnO_2$, x (mol %) were 6, 15, 36, 49, 63 and 74, respectively.

Figure 6:
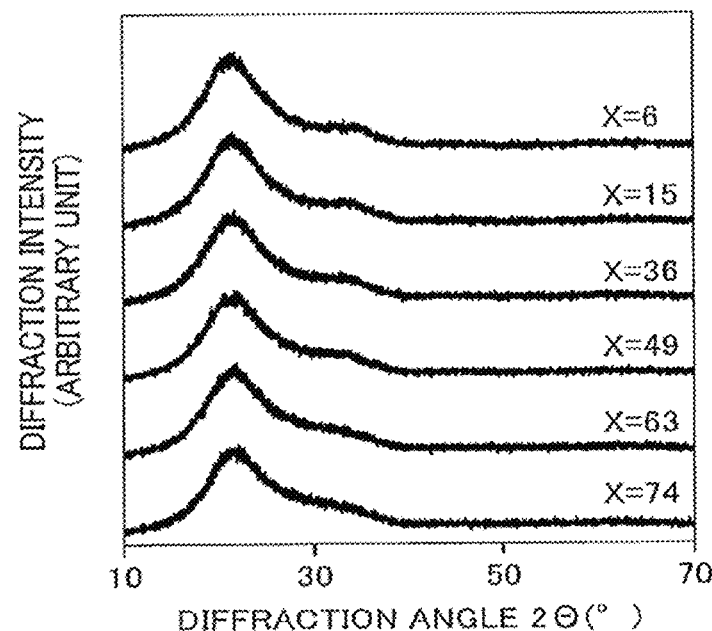
FIG. 6 illustrates a diffraction pattern of a thin film of ZTO obtained in Example 3.

FIG. 6 illustrates X-ray diffraction patterns obtained for the respective thin films. As illustrated in FIG. 6, in any of the thin films, a well-defined (distinct) peak cannot be recognized in the diffraction patterns, but a surrounding halo was observed. According to the above-described results, it was found that the thin film, obtained as above, was amorphous or a state of amorphous substance was dominant.

A reflection rate and a transmission rate of the obtained thin film were measured, and the optical absorption characteristic was evaluated.

Figure 7:
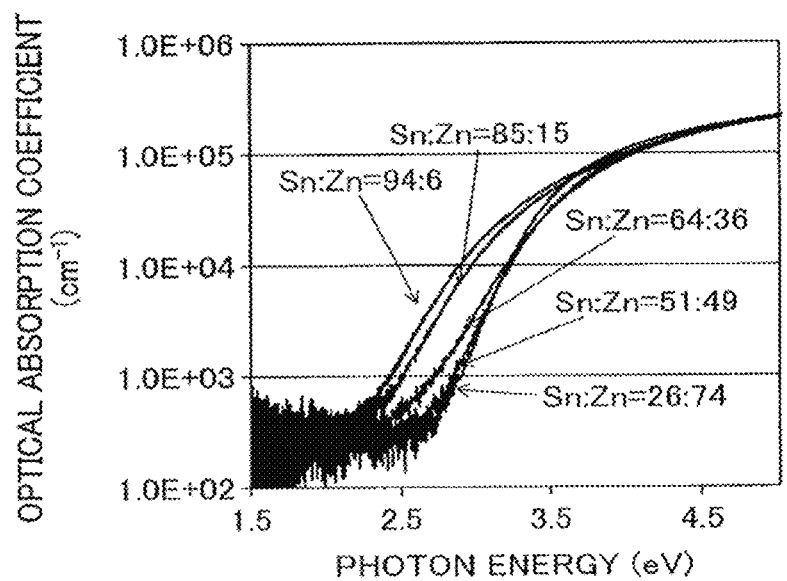
FIG. 7 illustrates an optical absorption characteristic of the thin film of the ZTO obtained in Example 3.

FIG. 7 illustrates optical absorption characteristics of the respective thin films. The thin films were found to be transparent in a visible range.

Figure 8:
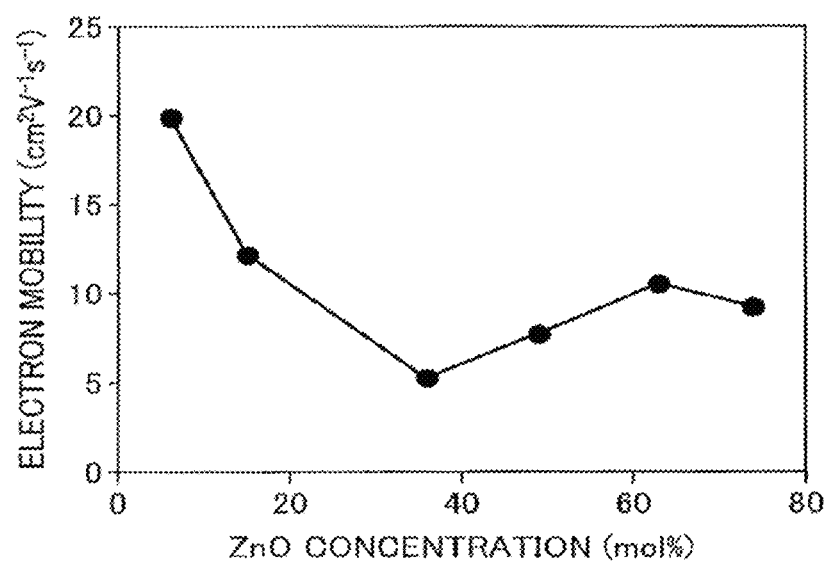
FIG. 8 illustrates an electron mobility of the thin film of the ZTO obtained in Example 3.

FIG. 8 illustrates electron mobility of the respective thin films obtained by the Hall effect measurement. For any of the thin films, with respect to electron mobility, values of 5 to 20 $cm^2V^{-1}s^{-1}$ were obtained.

Reference Example

Here, an "amorphous metal material, which is a metal oxide, includes zinc (Sn), silicon (Si), and oxygen (O), and in terms of oxide, based on 100 mol % of total of oxides of the amorphous metal materials, $SnO_2$ is 15 mol % or more but 95 mol % or less", will be specifically referred to as "TSO".

In TSO, in terms of oxide, based on 100 mol % of total of metal oxides, $SnO_2$ is 50 mol % or more but 93 mol % or less, for example. $SnO_2$ may be 60 mol % or more but 90 mol % or less, and preferably 70 mol % or more but 85 mol % or less.

The chemical formula of TSO is preferably expressed by $xSiO_2 \cdot (1-x)SnO_2$ (x=0.05 to 0.85). Here, x (molar ratio) falls, for example, within a range of 0.07 to 0.50, and may fall within a range of 0.10 to 0.40. Furthermore, x preferably falls within a range of 0.15 to 0.30. TSO is preferably in a form of a complex metal oxide.

For example, the thin film of TSO can be formed by performing deposition on a substrate by a vapor deposition method using a target including silicon (Si) and tin (Sn).

When a single target is used, the atomic fraction of Si/(Sn+Si) in the target may be 0.05 to 0.85, may be 0.07 to 0.50, may be 0.10 to 0.40, or may be 0.15 to 0.30.

Because for TSO, a valence number of Sn tends to change easily, and the film property may change due to a subtle difference in the deposition condition, a problem may arise in homogeneity and reproducibility compared with ZTSO or ZTO. However, there is a case in which TSO exhibits characteristics that are relatively close to those of ZTSO or ZTO.

Mixed power of $SiO_2$—$SnO_2$ that was casted was calcined at 1300° C. for 5 hours in air, and a target was fabricated. As targets, two kinds of targets with different compositions were used.

Using the above-described targets, by the PLD method (KrF excimer laser: wavelength 248 nm), (two kinds of) thin films of ZTO were deposited on the quartz substrate, which was optically polished and had a thickness of 1 mm. Specifically, the quartz substrate was arranged in a vacuum chamber, air was exhausted to $3 \times 10^{-6}$ Pa, oxygen was introduced in the vacuum chamber, and the deposition was performed in surroundings of pressure at 5.0 Pa.

By the XRF method, compositions of both thin films were evaluated, where in the chemical formula $xSiO_2 \cdot (1-x)SnO_2$, x (molar ratio) values were 0.15 and 0.30, respectively.

Figure 9:
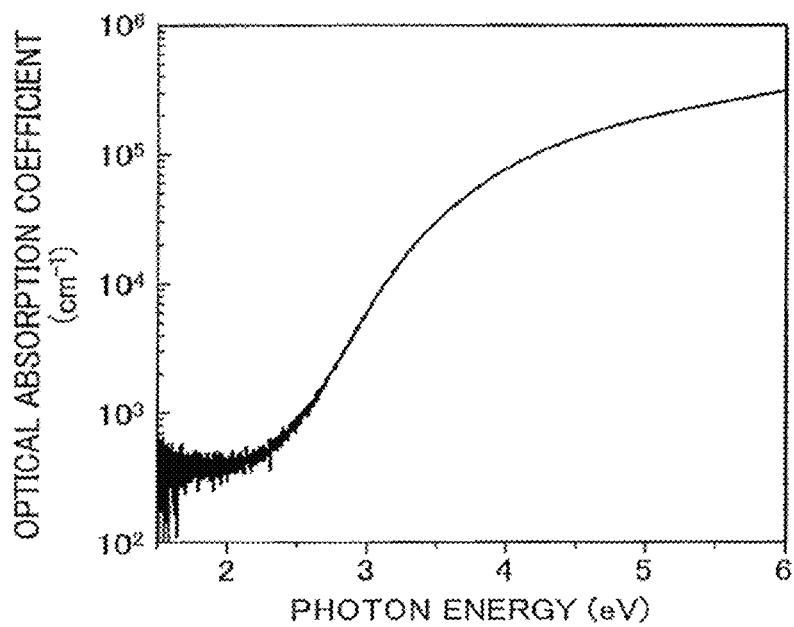
FIG. 9 illustrates an optical absorption characteristic of a thin film of TSO obtained in reference example.
Figure 10:
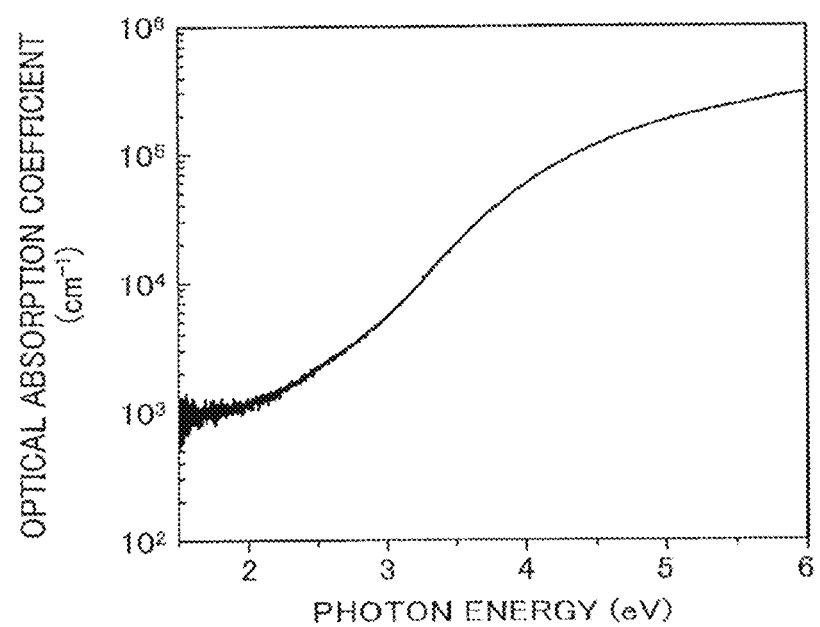
FIG. 10 illustrates an optical absorption characteristic of a thin film of another TSO obtained in reference example.

FIGS. 9 and 10 illustrate optical absorption coefficients of the obtained thin films. The thin films were transparent in a visible range. For both thin films, the optical band gaps obtained from the Tauc plot were 2.8 eV and 3.0 eV, respectively.

The thin film of metal oxide of the invention may be applied to a photoelectric conversion device such as an organic electroluminescent device, an organic photovoltaic cell or the like. The organic electroluminescent device may be a tandem structure in which a plurality of light emitting layers are connected by an intermediate layer. The photovoltaic cell may be an organic photovoltaic cell or an inorganic photovoltaic cell, and may be a tandem structure in which a plurality of photoelectric conversion layers are connected and stacked.

The organic electroluminescent device of the invention may be used as a display device of a display apparatus. The display apparatus including the organic electroluminescent device of the invention may be adapted to various electronic devices. For example, the organic electroluminescent device of the invention may be incorporated in a display unit of a display device such as a television or the like, an imaging device such as a digital camera or the like, a digital data processing apparatus such as a computer or the like, a mobile terminal device such as a mobile phone or the like as a display apparatus. Further, the organic electroluminescent device of the invention may be incorporated in a display unit in a vehicle, a display unit of a car navigation device or the like.

The display apparatus including the organic electroluminescent device of the invention may be provided in a window, a door, a ceiling, a floor, a wall, a partition or the like of an architectural structure or a mobile body (a vehicle, an aircraft, a ship or the like). Further, the display apparatus may be included in a public transportation vehicle, an advertising board in town, an advertising tower or the like as an advertisement display apparatus. The organic electroluminescent device may be used as a light source of an illumination apparatus, or a light source of a display apparatus.

The characteristic of a photoelectric conversion device in the related art is still insufficient and it is required to improve performance of each layer member such as an electron transport layer or the like in order to improve the characteristic of the photoelectric conversion device. Thus, a layer member capable of improving the characteristic is required. In particular, organic substances having high electron mobility are not obtained easily for an organic electroluminescent device, and if the electron transport layer is formed to be thick, driving voltage of the device often rises. Thus, it is difficult to increase the distance between the cathode and the light emitting layer. For the cathode, generally, a metal with a low work function such as aluminum or magnesium is often used. However, if the metal is in proximity to the light emitting layer by about 50 nm or less, optical loss occurs because Evanescent light (near-field light) and surface plasmon are coupled at a surface of the metal. Such loss causes greatly reduced external quantum efficiency (a ratio of the number of photons emitted outside the organic electroluminescent device to the number of electrons injected into the light emitting layer).

According to the present invention, a thin film with good electron transport capability can be provided. According to the present invention, an organic electroluminescent device having better stability with higher reliability compared with a conventional one can be provided. According to the present invention, a photovoltaic cell having better stability with higher reliability compared with a conventional one can be provided. According to the present invention, a manufacturing method of a thin film with good electron transport capability can be provided.

Further, the present invention is not limited to these examples, but various variations and modifications may be made without deviating from the scope of the present invention.

What is claimed is:

1. A manufacturing method of manufacturing a thin film, the thin film comprising zinc (Zn), tin (Sn), silicon (Si) and oxygen (O); and wherein in terms of oxide, based on 100 mol % of total of oxides of the thin film, $SnO_2$ is present in the thin film in an amount of greater than 15 mol % and less than or equal to 95 mol %, the method comprising:
before forming the thin film in a vacuum chamber by a sputtering method,
reducing a pressure in the vacuum chamber to $8.0\times10^{-4}$ Pa or less;
introducing a sputtering gas comprising oxygen into the vacuum chamber; and
setting the pressure in the vacuum chamber to 0.1 Pa or more but 5.0 Pa or less, to perform deposition of the thin film, and
depositing the thin film by depositing zinc (Zn), tin (Sn), silicon (Si), and oxygen (O), in the vacuum chamber in which air is exhausted and oxygen was introduced, by a pulsed laser deposition (PLD) method.

2. The manufacturing method according to claim 1, wherein a target used in the sputtering method comprises Zn, Sn, and Si, and wherein an atomic fraction of silicon atoms as defined by Si/(Zn+Sn+Si) in the target is greater than or equal to 0.01 but less than or equal to 0.70.

3. The method according to claim 1, wherein a thickness of the thin film is greater than or equal to 10 nm and less than or equal to 2000 nm.

4. The method according to claim 1, wherein a thickness of the thin film is greater than or equal to 200 nm and less than or equal to 2000 nm.

5. The method according to claim 1, the thin film comprising zinc (Zn), tin (Sn), silicon (Si) and oxygen (O); and wherein in terms of oxide, based on 100 mol % of total of oxides of the thin film, $SnO_2$ is present in the thin film in an amount of greater than 80 mol % and less than or equal to 95 mol %.

6. The method according to claim 1, wherein the thin film is used for manufacturing an organic electroluminescent device, the organic electroluminescent device comprising at least one layer selected from the group consisting of an electron injection layer and a hole blocking layer,
wherein: the at least one layer is a thin film of metal oxide comprising zinc (Zn), tin (Sn) silicon (Si), and oxygen (O); and wherein in terms of oxide, based on 100 mol % of total of oxides of the thin film, $SnO_2$ is present in the thin film in an amount of greater than or equal to 15 mol % and less than or equal to 95 mol %.

7. A method of manufacturing a thin film, the thin film comprising zinc (Zn), tin (Sn), and oxygen (O); and wherein in terms of oxide, based on 100 mol % of total of oxides of the thin film, $SnO_2$ is present in the thin film in an amount of greater than 15 mol % and less than or equal to 95 mol %, the method comprising:
before forming the thin film in a vacuum chamber by a sputtering method,
reducing a pressure in the vacuum chamber to $8.0\times10^{-4}$ Pa or less;
introducing a sputtering gas comprising oxygen into the vacuum chamber; and
setting the pressure in the vacuum chamber to 0.1 Pa or more but 5.0 Pa or less, to perform deposition of the thin film, and
depositing the thin film by depositing zinc (Zn), tin (Sn), and oxygen (O), in the vacuum chamber in which air is exhausted and oxygen was introduced, by a pulsed laser deposition (PLD) method.

8. The method according to claim 7, wherein the thin film is used for manufacturing an organic electroluminescent device, and the thin film includes silicon (Si).

9. The method according to claim 7, wherein the thin film is used for manufacturing an organic electroluminescent device, and the thin film does not substantially include silicon (Si).

10. The method according to claim 7, wherein the thin film is used for manufacturing a photovoltaic cell, and the thin film includes silicon (Si).

11. The method according to claim 7, wherein the thin film is used for manufacturing a photovoltaic cell, and the thin film does not substantially include silicon (Si).

* * * * *